(12) United States Patent
Zhu et al.

(10) Patent No.: US 12,108,591 B2
(45) Date of Patent: Oct. 1, 2024

(54) SEMICONDUCTOR STRUCTURE, METHOD FOR FORMING SEMICONDUCTOR STRUCTURE AND MEMORY

(71) Applicant: CHANGXIN MEMORY TECHNOLOGIES, INC., Hefei (CN)

(72) Inventors: Yiming Zhu, Hefei (CN); Erxuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 470 days.

(21) Appl. No.: 17/458,992

(22) Filed: Aug. 27, 2021

(65) Prior Publication Data

US 2021/0391332 A1 Dec. 16, 2021

Related U.S. Application Data

(63) Continuation of application No. PCT/CN2021/089780, filed on Apr. 26, 2021.

(30) Foreign Application Priority Data

Apr. 27, 2020 (CN) .......................... 202010343511.9

(51) Int. Cl.
*H10B 12/00* (2023.01)
*H01L 29/06* (2006.01)

(52) U.S. Cl.
CPC ....... *H10B 12/312* (2023.02); *H01L 29/0649* (2013.01); *H10B 12/482* (2023.02)

(58) Field of Classification Search
CPC ................ H10B 12/312; H10B 12/482; H01L 29/0649
See application file for complete search history.

(56) References Cited

U.S. PATENT DOCUMENTS

| 7,138,685 B2 | 11/2006 | Hsu |
| 8,309,416 B2 | 11/2012 | Park |

(Continued)

FOREIGN PATENT DOCUMENTS

| CN | 102484052 A | * | 5/2012 | ............ B82Y 10/00 |
| CN | 102544049 A | | 7/2012 | |

(Continued)

OTHER PUBLICATIONS

Supplementary European Search Report in the European application No. 21766093.5, mailed on May 11, 2022, 8 pgs.

(Continued)

*Primary Examiner* — Michael Lebentritt
(74) *Attorney, Agent, or Firm* — Kilpatrick Townsend & Stockton LLP

(57) ABSTRACT

A method for forming a semiconductor structure includes: providing a substrate, where a sacrificial layer and an active layer located on the sacrificial layer are formed on the substrate; patterning the active layer and the sacrificial layer to form a groove, where the active layer and the sacrificial layer are divided into a plurality of active regions by the groove; forming a first isolation layer surrounding the active regions in the groove; patterning the active layer in the active regions to form a plurality of separate active patterns, where at least one of side walls or ends of the active patterns is connected to the first isolation layer; removing the sacrificial layer along an opening located between two adjacent one of the active patterns to form a gap between a bottom of the active patterns and the semiconductor substrate; and forming a bit line in the gap.

18 Claims, 34 Drawing Sheets

(56) References Cited

U.S. PATENT DOCUMENTS

| | | |
|---|---|---|
| 8,643,096 B2 | 2/2014 | Hwang |
| 8,921,930 B2 | 12/2014 | Hwang |
| 9,000,409 B2 | 4/2015 | Huo |
| 9,087,856 B2 | 7/2015 | Hwang |
| 9,673,257 B1 | 6/2017 | Takaki et al. |
| 10,134,739 B1 | 11/2018 | Zang |
| 2004/0113207 A1 | 6/2004 | Hsu |
| 2007/0007601 A1 | 1/2007 | Hsu |
| 2011/0073925 A1 | 3/2011 | Park |
| 2012/0135573 A1 | 5/2012 | Kim |
| 2012/0161094 A1 | 6/2012 | Huo |
| 2013/0234242 A1 | 9/2013 | Hwang |
| 2014/0110781 A1 | 4/2014 | Hwang |
| 2014/0247647 A1* | 9/2014 | Song .................... G06F 3/0685 257/295 |
| 2015/0079744 A1 | 3/2015 | Hwang |
| 2019/0035791 A1 | 1/2019 | Zang et al. |
| 2019/0157345 A1 | 5/2019 | Zhu et al. |
| 2021/0074334 A1 | 3/2021 | Zhu |

FOREIGN PATENT DOCUMENTS

| | | | | |
|---|---|---|---|---|
| CN | 102468181 B | | 3/2016 | |
| CN | 107946174 A | * | 4/2018 | ......... C23C 16/0272 |
| CN | 109285838 A | | 1/2019 | |
| CN | 110383476 A | | 10/2019 | |
| CN | 211719592 U | | 10/2020 | |
| CN | 106128958 B | * | 6/2021 | ..... H01L 21/823821 |
| CN | 113948514 A | * | 1/2022 | |
| CN | 115223942 A | * | 10/2022 | ....... H01L 21/76897 |
| CN | 115312385 A | * | 11/2022 | ......... H01L 21/3081 |
| CN | 115332347 A | * | 11/2022 | ............. H01L 29/06 |
| WO | 2022007540 A1 | | 1/2022 | |

OTHER PUBLICATIONS

International Search Report in the international application No. PCT/CN2021/089780, mailed on Jul. 26, 2021, 2 pgs.

* cited by examiner

SEMICONDUCTOR STRUCTURE, METHOD FOR FORMING SEMICONDUCTOR STRUCTURE AND MEMORY

CROSS-REFERENCE TO RELATED APPLICATION

This application is a continuation application of International Patent Application No. PCT/CN2021/089780, filed on Apr. 26, 2021, entitled "semiconductor structure, method for forming semiconductor structure, memory and method for forming memory", which claims priority to Chinese patent application No. 202010343511.9, filed on Apr. 27, 2020, entitled "semiconductor structure, method for forming semiconductor structure, memory and method for forming memory". The contents of International Patent Application No. PCT/CN2021/089780 and Chinese patent application No. 202010343511.9 are hereby incorporated by reference in their entireties.

TECHNICAL FIELD

This application relates to the field of the semiconductor technology, and particularly relates to a semiconductor structure and a method for forming the semiconductor structure and a memory.

BACKGROUND

An existing memory usually includes a data memory cell and a control transistor for controlling the data memory cell. The integration level of the transistor restricts the storage density of the memory. For a planar transistor, the related art reduces the size of the transistor by reducing the channel size of the transistor, thereby improving the storage density of the memory.

However, as the channel size of the transistor reduces, the narrow channel effect and the short channel effect cause the performance of the transistor to decline, so that the performance of the memory is affected, and the further improvement of the size of the transistor and the storage density of the memory is restricted.

How to reduce the planar size of the transistor and improve the storage density of the memory without reducing the performance of the transistor is an urgent problem to be solved at present.

SUMMARY

The technical problem to be solved by the embodiments of this application is to provide a semiconductor structure, a method for forming the semiconductor structure, a memory, and a method for forming the memory.

In order to solve the above problem, the embodiments of this application provide a method for forming a semiconductor structure, including: a substrate is provided, a sacrificial layer and an active layer located on the sacrificial layer being formed on the substrate; the active layer and the sacrificial layer are patterned to form a groove, the active layer and the sacrificial layer being divided into a plurality of active regions by the groove; the groove is filled to form a first isolation layer surrounding the active regions; the active layer in the active regions is patterned to form a plurality of separate active patterns, at least one of side walls or ends of the active patterns being connected to the first isolation layer; the sacrificial layer is removed along an opening located between two adjacent ones of the active patterns to form a gap between a bottom of the active patterns and the substrate; and a bit line is formed in the gap.

The embodiments of this application further provide a semiconductor structure. The semiconductor structure includes: a substrate; a plurality of separate active patterns located on the substrate, a gap being formed between a bottom of the active patterns and the substrate; a first isolation layer located on the substrate and surrounding the active patterns, at least one of side walls or ends of the active patterns is connected to the first isolation layer; and bit lines located in the gap.

The embodiments of this application further provide a memory, including: a semiconductor structure; and a memory cell located above the semiconductor structure. The semiconductor structure includes: a substrate; a plurality of separate active patterns located on the substrate, a gap being formed between a bottom of the active patterns and the substrate; a first isolation layer located on the substrate and surrounding the active patterns, at least one of side walls or ends of the active patterns is connected to the first isolation layer; and bit lines located in the gap. The memory cell is connected to a top of a respective one of the active patterns.

BRIEF DESCRIPTION OF THE DRAWINGS

In order to more clearly illustrate the technical solutions in the embodiments of this application, the drawings required for the embodiments of this application will be briefly described below. It is apparent that the drawings in the following description are only some embodiments of this application. Those skilled in the art can also obtain other drawings according to these drawings without any creative work.

DETAILED DESCRIPTION

In order to make the objectives, technical means and effects of this application clearer, this application will be further elaborated below in conjunction with the drawings. It should be understood that the embodiments described here are only a part of the embodiments of this application, rather than all of the embodiments, and are not intended to limit this application. Based on the embodiments in this application, all other embodiments obtained by those skilled in the art without creative efforts fall within the protection scope of this application.

FIG. 1 to FIG. 14C are schematic views of a forming process of a semiconductor according to an embodiment of this application.

Figure 1:
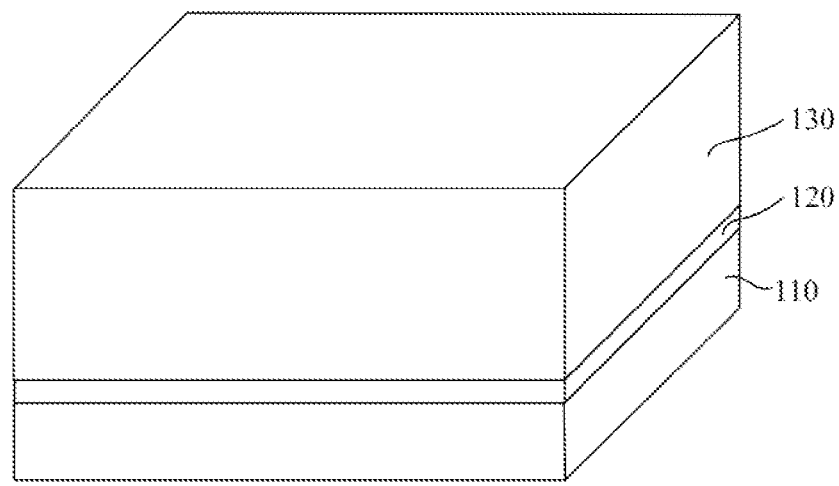
FIG. 1 to FIG. 14C are schematic views of a forming process of a semiconductor according to an embodiment of this application.

Referring to FIG. 1, a substrate 110 is provided, and a sacrificial layer 120 and an active layer 130 located on a surface of the sacrificial layer 120 are formed on a surface of the substrate.

The substrate 110 may be made of various semiconductor materials such as single crystal silicon, germanium and SiC. The substrate 110 may be a single-layer structure, or may be a composite structure including a semiconductor substrate and dielectric layers formed on a surface of the semiconductor substrate, which is not limited herein.

The sacrificial layer 120 and the active layer 130 may be sequentially formed on the substrate 110 by a deposition process. The active layer 130 may be made of one or more of semiconductor materials such as Si, Ge, SiC or SiGe. The material of the sacrificial layer 120 is different from the materials of the substrate 110 and the active layer 130, so that the influence on the substrate 110 and the active layer 130 is reduced during the subsequent removal of the sacrificial layer 120.

In this embodiment, the substrate 110 is a silicon substrate, the sacrificial layer 120 is a SiGe layer, and the active layer is a silicon layer. After the sacrificial layer 120 is epitaxially formed on the surface of the substrate 110 through an epitaxial growth process, the active layer 130 is formed on the surface of the sacrificial layer 120 through an epitaxial process.

In fact, the material of the sacrificial layer 120 is different from the materials of the substrate 110 and the active layer 130, and there is a higher etching selection ratio between the sacrificial layer 120 and the substrate 110 and there is a higher etching selection ratio between the sacrificial layer 120 and the active layer 130 during the removal of the sacrificial layer 120.

In some embodiments, the substrate 110, the sacrificial layer 120 and the active layer 130 may be an SOI substrate, and a buried oxide layer in the SOI substrate serves as the sacrificial layer 120.

In other embodiments, a doped layer may be formed inside a bulk silicon substrate to serve as the sacrificial layer 120 by implanting ions in the bulk silicon substrate. For example, Ge is implanted in the bulk silicon, and a SiGe layer is formed inside the bulk silicon to serve as the sacrificial layer 120 by controlling the implantation depth of Ge. The silicon layer below the doped layer serves as the substrate 110, and the silicon layer above the doped layer serves as the active layer. In other embodiments, the doped layer may also be formed by implanting other elements, such as C, O and N. The etching rate of the doped layer is different from that of the material layer above the doped layer and that of the material layer below the doped layer, so that the sacrificial layer 120 is formed. Preferably, the material of the sacrificial layer 120 may be silicon oxide, silicon nitride, silicon oxynitride, silicon oxycarbide, etc.

The active layer 130 is configured to form a vertical transistor, and the sacrificial layer 120 is configured to be replaced subsequently to form a bit line. According to the size of the vertical transistor to be formed and the size of the bit line, the thicknesses of the sacrificial layer 120 and the active layer 130 are set reasonably. In an embodiment, the thickness of the sacrificial layer 120 may be comprised between 35 nm and 50 nm.

Figure 2A:
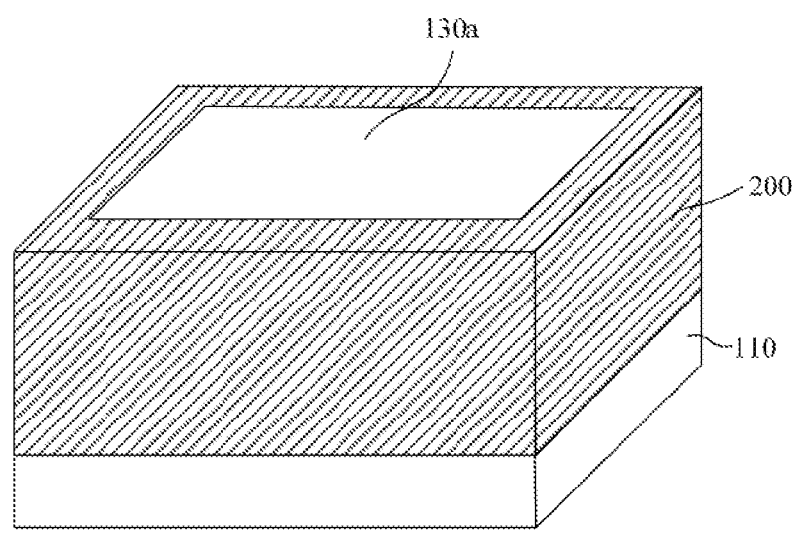
Figure 2B:
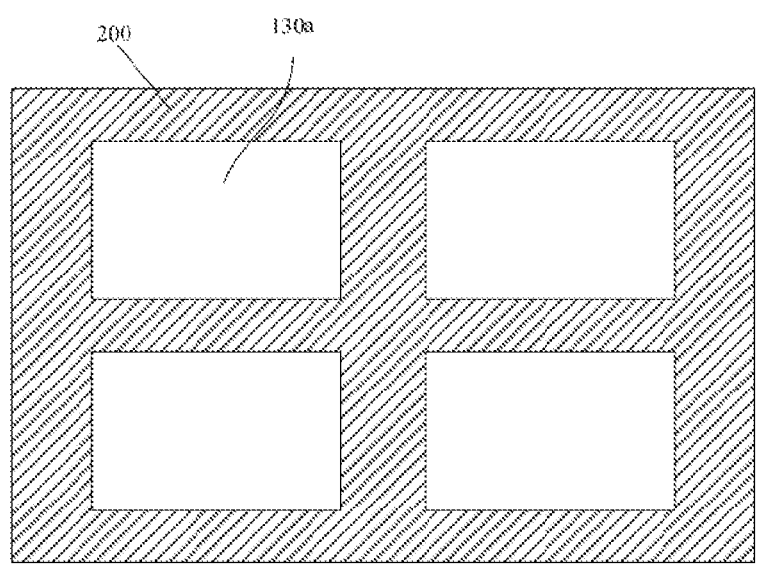

Referring to FIG. 2A and FIG. 2B, the active layer 130 and the sacrificial layer 120 are patterned to form a groove, and the active layer 130 (referring to FIG. 1) and the sacrificial layer 120 (referring to FIG. 1) are divided into a plurality of active regions 130a by the groove. A first isolation layer 200 surrounding the active regions 130a is formed in the groove.

The active layer 130 and the sacrificial layer 120 are etched to the surface of the semiconductor substrate 110 to form the groove, to divide the active layer 130 into a plurality of active regions 130a. The groove is filled with a dielectric material and flattened to form the first isolation layer 200, to realize horizontal electrical isolation between the active regions 130a.

FIG. 2A shows a schematic view of an active region 130a surrounded by the first isolation layer 200. FIG. 2B shows a schematic top view of a plurality of active regions 130a and the first isolation layer 200.

The size of the active region 130a may be designed according to the needs. In some embodiments, in a case that the active region 130a is configured to form a control transistor of a memory, the active region 130a may correspond to a storage block.

Figure 3A:
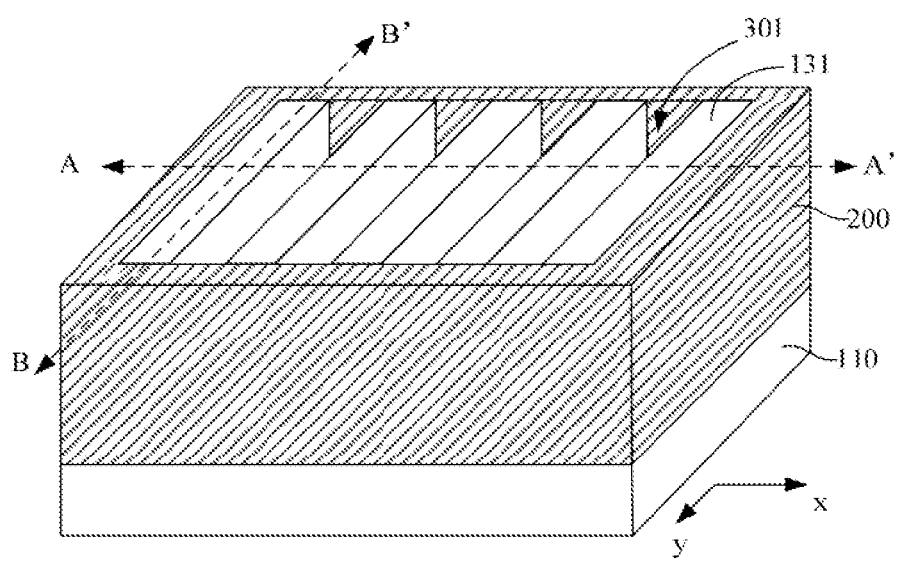
Figure 3B:
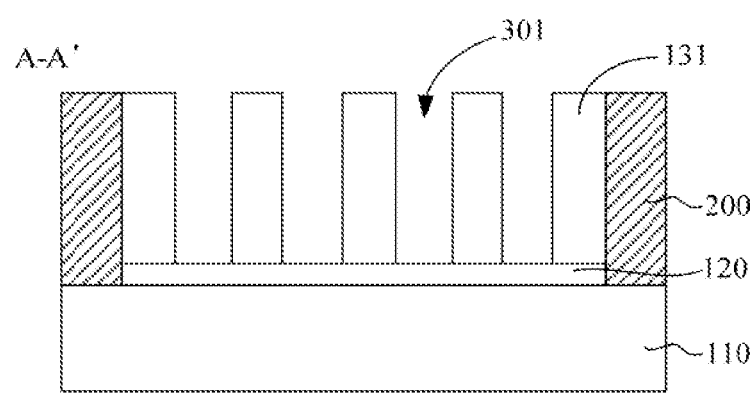
Figure 3C:
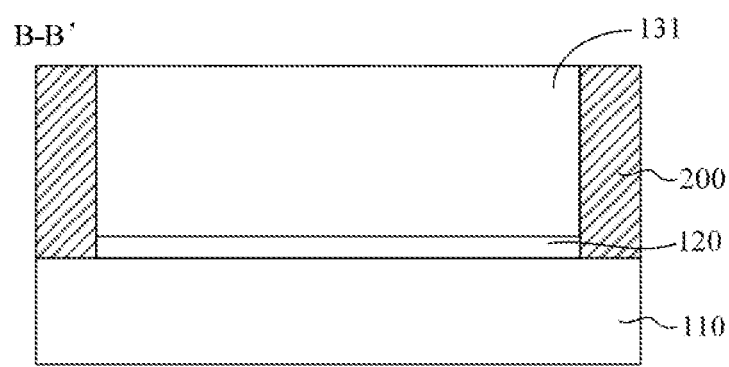

Referring to FIG. 3A to FIG. 3C, the active layer in the active regions 130a is patterned to form a plurality of separate active patterns, and at least one of side walls or ends of the active patterns is connected to the first isolation layer 200. FIG. 3B is a schematic cross-sectional view along a line A-A' in FIG. 3A. FIG. 3C is a schematic cross-sectional view along a line B-B' in FIG. 3A.

In this embodiment, the active layer in the active regions 130a is patterned to form a plurality of strip-shaped active lines 131 arranged in parallel and extending along a first direction (y direction), and an opening 301 is formed between two adjacent ones of the active lines 131. The ends of the active lines 131 are connected to the first isolation layer 200, and the side walls of the active lines 131 at the edges of the active regions 130a are also connected to the first isolation layer 200.

In this embodiment, only the active layer is patterned. In other embodiments, the sacrificial layer 120 may also be etched, to remove the sacrificial layer 120 at the bottom of each of the openings 301.

In this embodiment, the operation that the active lines 131 are formed includes the following operations. A patterned mask layer (not shown) is formed on the surface of the active layer 130, in which opening patterns extending along the first direction are formed in the patterned mask layer. The patterned mask layer is taken as a mask to etch the active layer 130 to form strip-shaped active lines 131 and openings 301.

In other embodiments, active pillars may also be formed by patterning the active layer in the active regions, and at least one of side walls of the active pillars is connected to the first isolation layer 200. For example, active pillars arranged in two rows or two columns are formed, and one side wall of each of the active pillars is connected to the first isolation layer 200, so that after the sacrificial layer 120 at the bottoms of the active pillars is removed subsequently, the active pillars can remain suspended.

Figure 4:
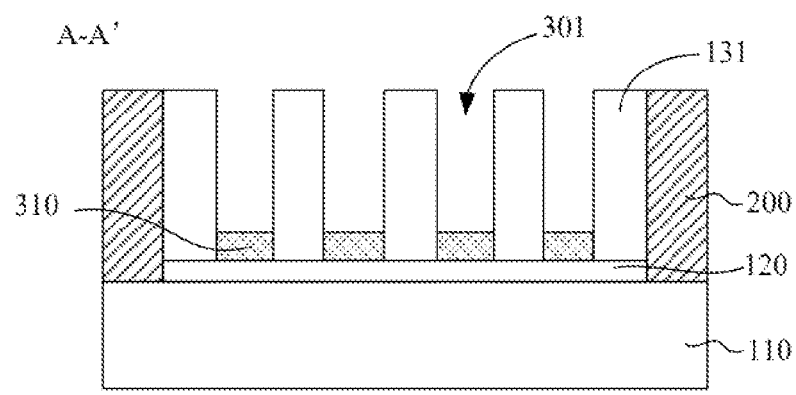

Referring to FIG. 4, a transition layer 310 with doped elements is formed on the surface of the substrate 110 between adjacent active lines 131. FIG. 4 is a schematic view similar to the view in FIG. 3B, in which the transition layer 310 has been formed.

A transition layer material may be deposited on the surface of the substrate 110 and then etched back to form a transition layer 310 with a certain thickness. The thickness of the transition layer 310 may be adjusted according to the size requirement of a source region/drain region of a transistor to be formed.

The material of the transition layer 310 is different from the material of the active lines 131, and may be a material that facilitates the diffusion of impurities, such as polysilicon, or other dielectric materials such as silicon oxide, silicon nitride and silicon oxynitride.

The operation that the transition layer 310 with doped elements is formed includes the following operation. After an undoped transition layer 310 with a certain thickness is formed on the surface of the semiconductor substrate 110, the transition layer 310 is doped through ion implantation. In this case, the tops of the active lines 131 are covered with a patterned mask layer, and the ion implantation can only dope the transition layer 310 by controlling the energy of the ion implantation. N-type or P-type ions, or atomic clusters with N-type or P-type ions are implanted into the transition layer 310 according to the type of the transistor to be formed. The doped elements in the transition layer 310 may be in the form of ions, atoms, compound molecules or clusters.

In other embodiments, during formation of the transition layer 310, the transition layer 310 with doped elements may be directly formed by adding the doped gas with doped elements to the deposition process gas by means of an in-situ doping process.

Figure 5A:
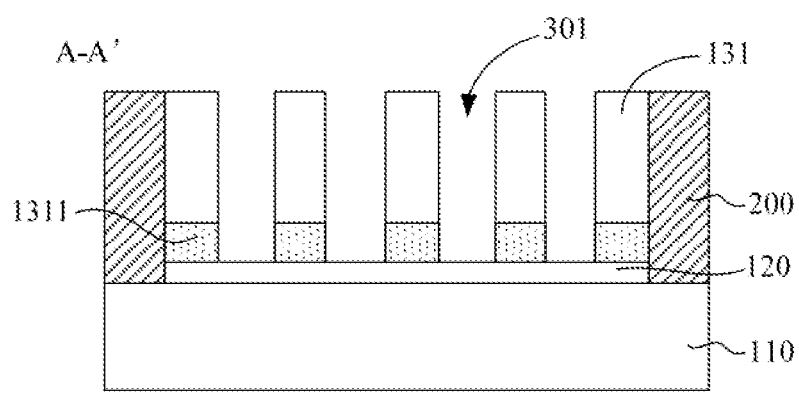
Figure 5B:
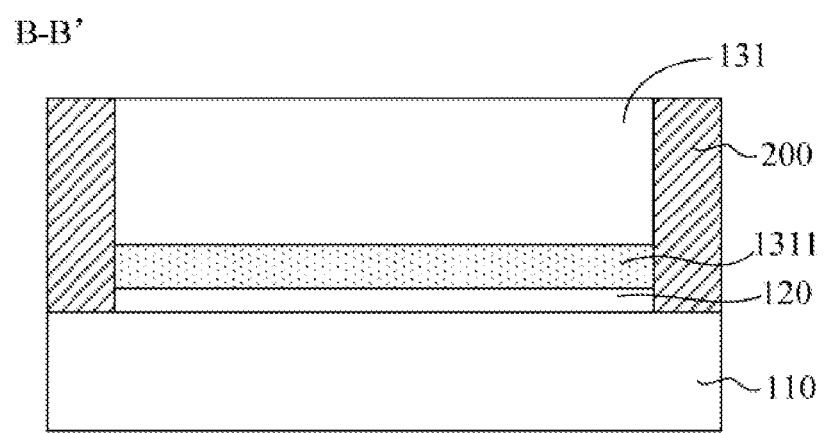

Referring to FIG. 5A and FIG. 5B, at least a part of the doped elements in the transition layer 310 with doped atoms are diffused into each of the active lines 131 by means of diffusion treatment to form a first doped region 1311.

The diffusion treatment may be a thermal annealing process. The annealing process with suitable parameters is selected according to the diffusion efficiency of the doped atoms, so that the doped elements in the transition layer 310 are diffused into the active lines 131 to form the first doped region 1311 with the thickness equal to the thickness of the transition layer 310.

The doping concentration in the first doped region 1311 formed after the diffusion treatment may be adjusted by adjusting the parameters, such as the concentration of the doped elements in the transition layer 310, the diffusion treatment time and the temperature.

The sacrificial layer 210 is also doped to a certain extent during formation of the first doped region 1311.

In other embodiments, after the patterned mask layer at the tops of the active lines 131 is removed, the active lines 131 may be directly implanted with doped ions to form the first doped region 1311. Specifically, the first doped region 1311 is formed at the bottoms of the active lines 131 by controlling the energy of the implanted ions in the ion implantation process and adjusting the implantation depth.

In other embodiments, in other subsequent operations, for example, after the active lines are patterned and the active pillars are further formed or in other operations, the first doped regions may be formed at the bottoms of the active lines or the active pillars by ion implantation.

In other embodiments, during deposition of the active layer by means of an epitaxial process, the active layer is doped using an in-situ doping process to form a first doped layer at the bottom of the active layer; and the first doped region is formed at the bottoms of the active lines through patterning the active layer.

Figure 6A:
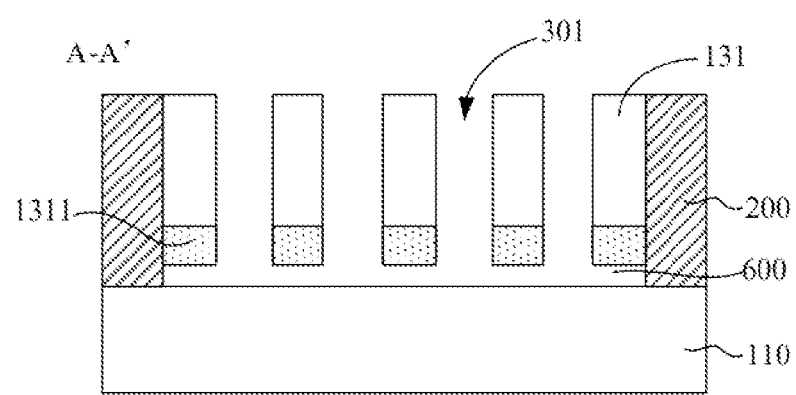
Figure 6B:
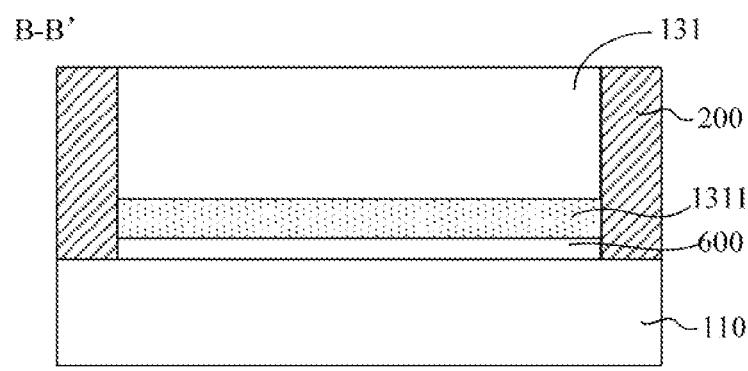

Referring to FIG. 6A and FIG. 6B, the sacrificial layer 120 is removed along the openings 301, and a gap 600 is formed between a bottom of the active lines 131 and the substrate 110.

The sacrificial layer 120 is removed by means of a wet etching process. Those skilled in the art can select a suitable etching solution according to the material of the sacrificial layer 120, so that in the wet etching process, there is a higher etching selection ratio between the sacrificial layer 120 and the active lines 131 as well as a higher etching selection ratio between the sacrificial layer 120 and the first isolation layer 200. Therefore, during removal of the sacrificial layer 120, the influence on the active lines 131 and the first isolation layer 200 is reduced.

After the sacrificial layer 120 is removed, the active lines 131 are supported by the first isolation layer 200 and suspended above the substrate 110, and a gap 600 is formed between the active lines 131 and the substrate 110.

Figure 7A:
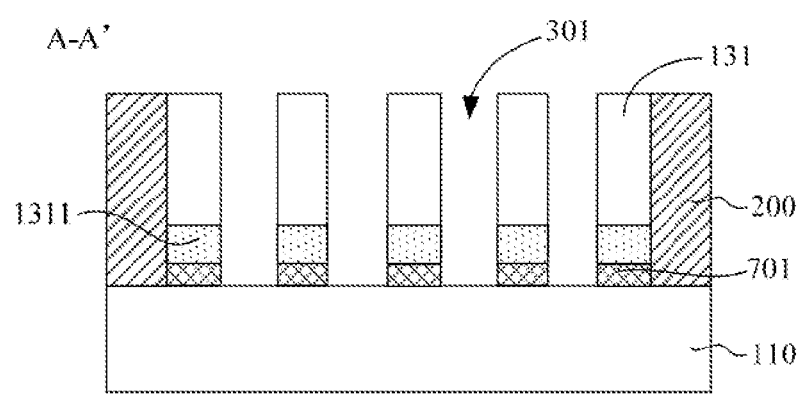
Figure 7B:
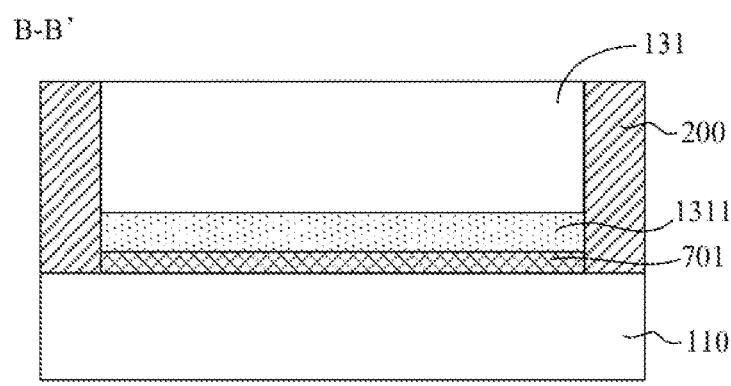

Referring to FIG. 7A to FIG. 7B, the gap 600 is filled with a conductive material to form a bit line 701 extending along the first direction.

A conductive material, such as polysilicon or a metal material such as Cu, Ag or Al, may be deposited in the gap 600 by means of a chemical vapor deposition process or a physical vapor deposition process.

The conductive material fills the gap 600 to form bit lines 701 located at the bottoms of the active lines 131. The conductive material also fills the openings 301 and covers the tops of the first isolation layer 200 and the active lines 131. Subsequently, the conductive material at the top of the first isolation layer 200 and the tops of the active lines 131 is removed by means of etching back or flattening, and the conductive material of the openings 301 is removed by etching, thereby avoiding interconnection between the bit lines 701 at the bottoms of adjacent active lines 131.

Figure 8A:
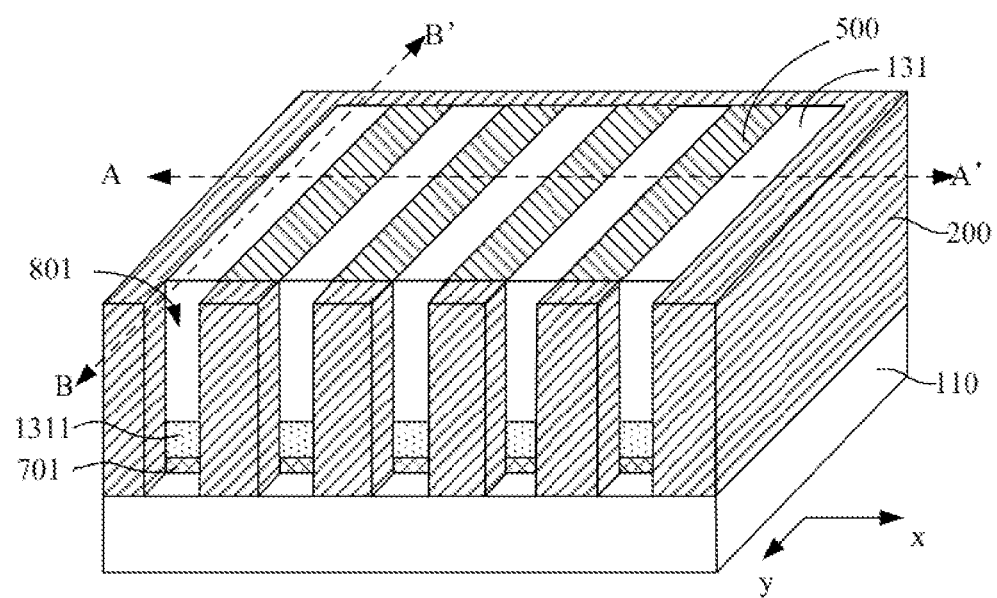
Figure 8B:
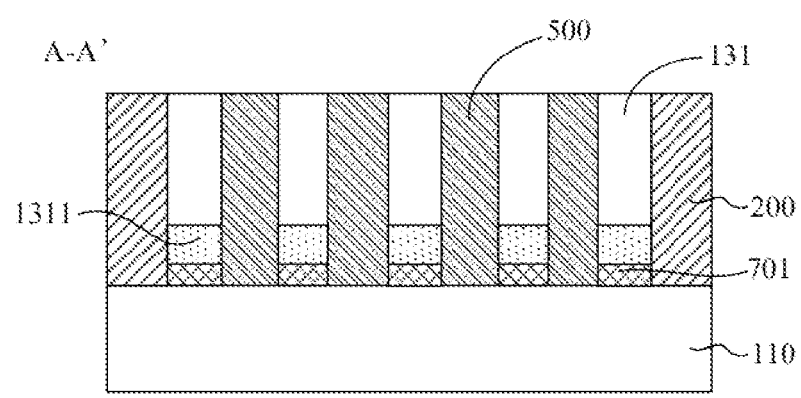
Figure 8C:
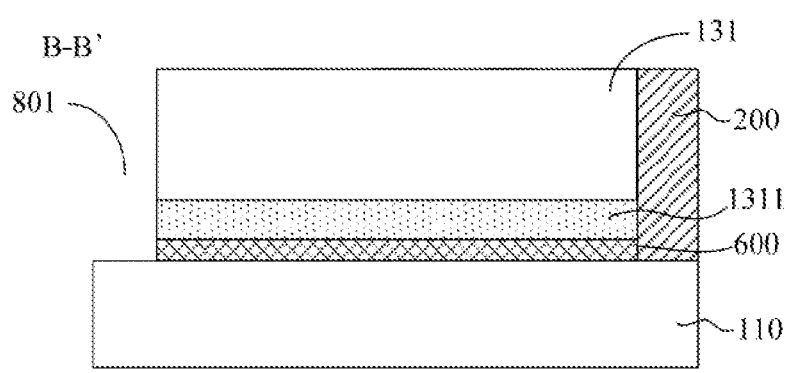

Referring to FIG. 8A to FIG. 8C, an isolation dielectric layer 500 is formed on the surface of the substrate 110 to fill the space between two adjacent ones of the active lines 131 and is flattened, and through holes 801 exposing the surface of the substrate 110 are formed at the ends of the active lines 131. FIG. 8B is a schematic cross-sectional view along a secant line A-A' in FIG. 8A. FIG. 8C is a schematic cross-sectional view along a secant line B-B' in FIG. 8A.

The material of the isolation dielectric layers 500 is a dielectric material configured to provide electrical isolation between the active lines 131. In this embodiment, the material of the isolation dielectric layers 500 is silicon oxide. In this embodiment, the operation that the isolation dielectric layers 500 are formed includes the following operation, After an isolation material layer filling the space between adjacent active lines 131 and covering the tops of the active lines 131 is formed on the surface of the substrate 110 by means of a chemical vapor deposition process, the isolation material layer is flattened to form the isolation dielectric layers 500. In this embodiment, the tops of the isolation dielectric layers 500 are flush with the tops of the active lines 131. In other embodiments, a patterned mask layer for forming the active lines by patterning the active layer is also retained at the tops of the active lines 131, and the first isolation layers 200 are flush with the patterned mask layer. In other embodiments, before the first isolation layers 200 are formed, the patterned mask layer has been removed, the first isolation layers 200 also cover the tops of the active lines 131, and the tops of the active lines 131 may be protected by the first isolation layers 200 in the subsequent operation.

The isolation dielectric layers 500 may provide a flat surface to form a mask layer for etching the active lines 131 to form through holes. In other embodiments, the isolation dielectric layers 500 may not be formed. During the etching of the active lines 131, the openings 301 are filled with the material of the mask layer, such as a bottom anti-reflection layer, to form a flat surface.

In this embodiment, the through holes 801 are formed by etching the first isolation layer 200 at the ends of the active lines 131, and bottom side walls of the through holes 801 expose the bit lines 701. In other embodiments, the through holes 801 may also be formed at other positions of the active lines 131.

Figure 9A:
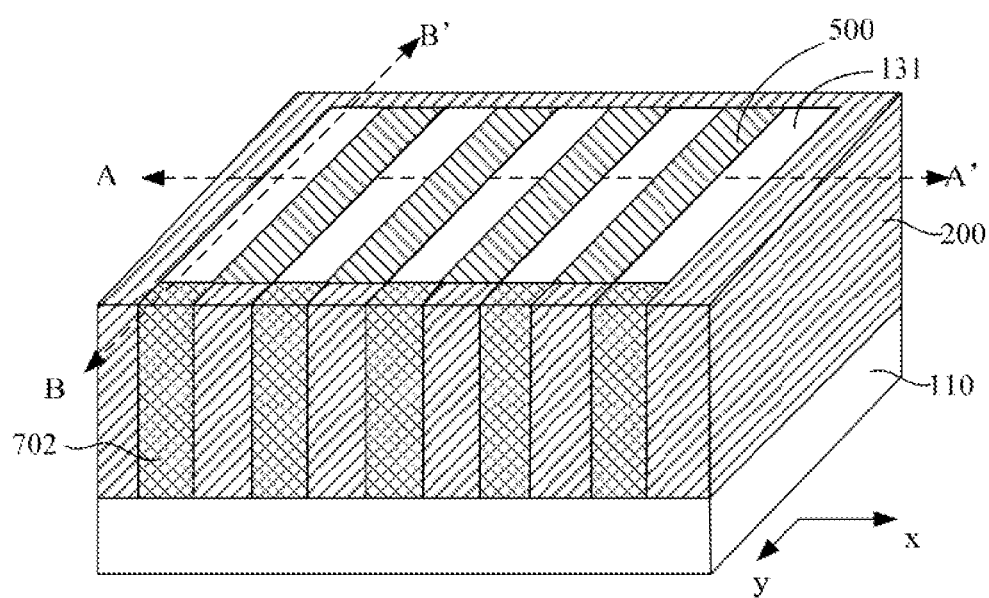
Figure 9B:
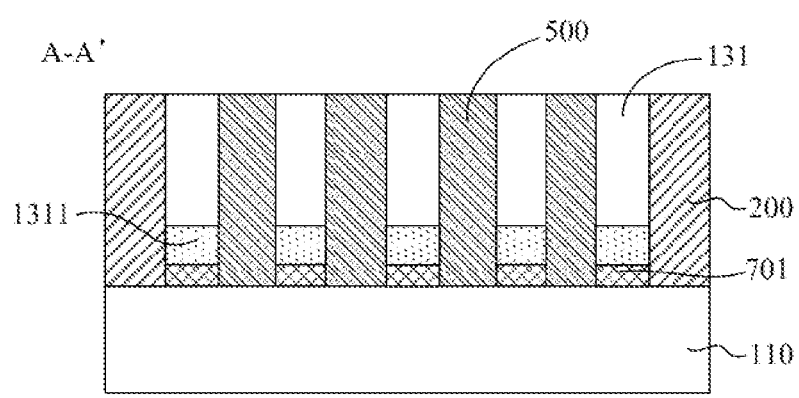
Figure 9C:
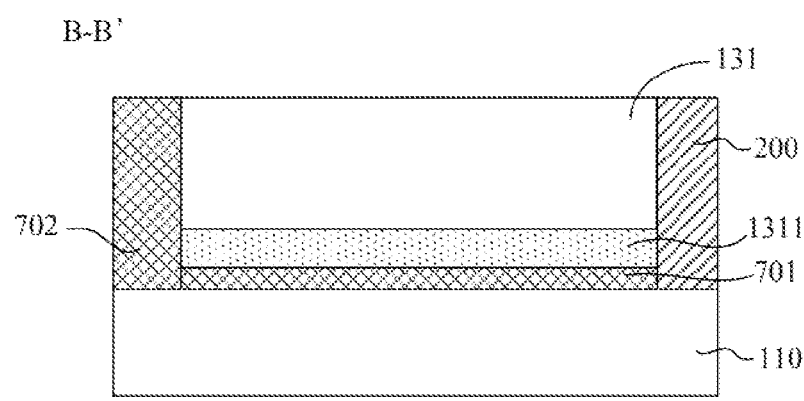

Referring to FIG. 9A to FIG. 9C, the through holes 801 are filled with a conductive material and flattened to form the bit-line-connection lines 702.

The bottom of each of the bit-line-connection lines 702 is connected to a respective one of the bit lines 701 to lead out the bit lines 701 buried below the active lines 131, thereby facilitating the application of control signals to the bit lines 701. The bit lines 701 are located below the active lines 131, form an electrical connection with the first doped region 1311 at the bottoms of the active lines 131, and extend along an extension direction of the active lines 131.

In other embodiments, the bit-line-connection lines 702 and the bit lines 701 may be formed in one operation. Specifically, the through holes 801 may be formed at the ends of the active lines 131 while the openings 301 are formed. During the formation of the bit lines 701, after the openings 301 and the through holes 801 are filled with the conductive material, a mask layer is formed on the through holes 801 at the ends. The mask layer is used to prevent the removal of the conductive material in the through holes 801 at the ends of the active lines 131 when the conductive material in the openings 301 is removed by etching, and the bit-line-connection lines 702 are formed by the conductive material retained in the through holes 801 at the ends of the active lines 131.

Figure 10A:
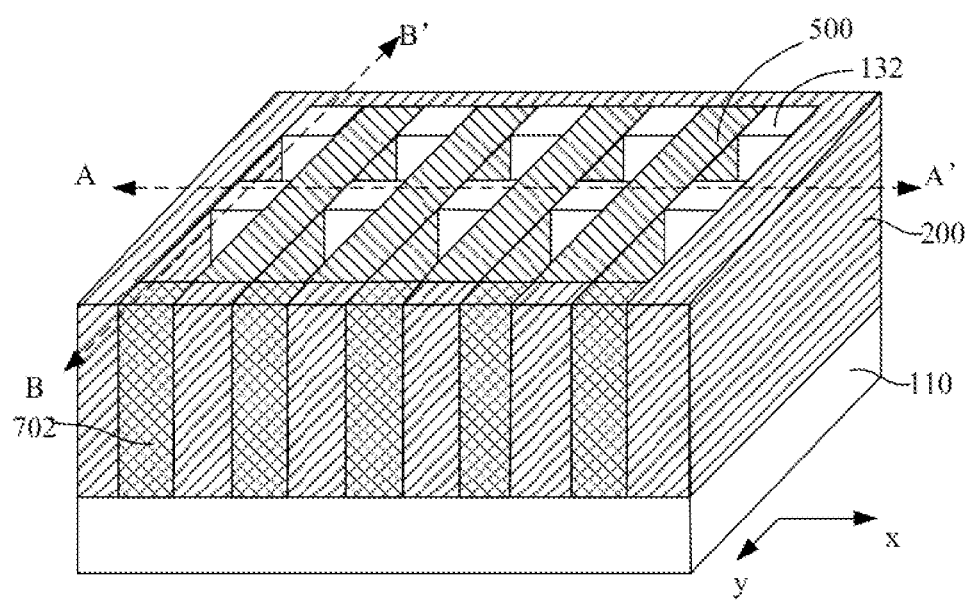
Figure 10B:
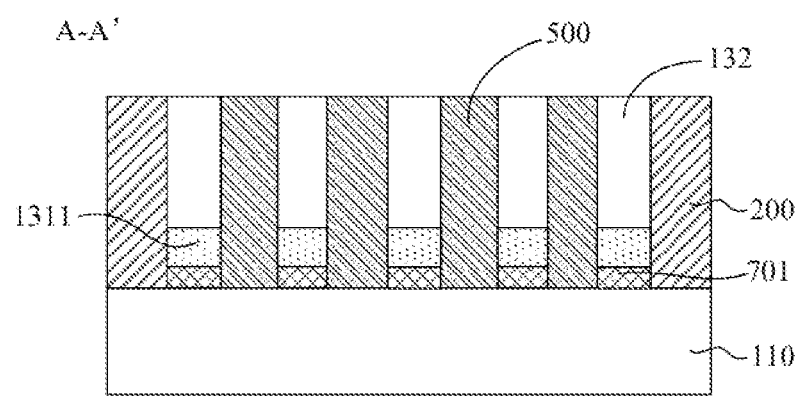
Figure 10C:
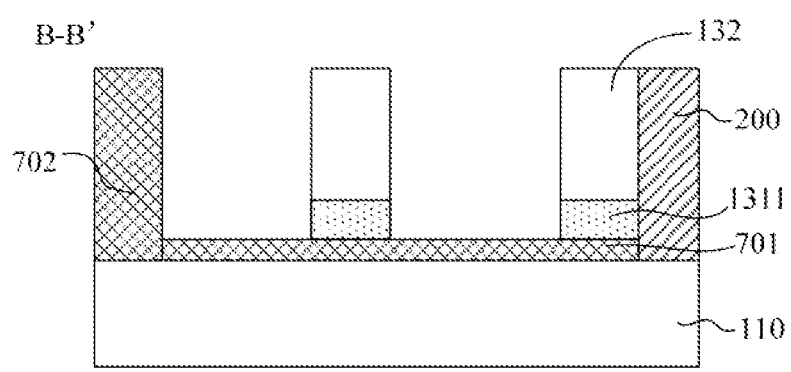

Referring to FIG. 10A to FIG. 10C, the active lines 131 are patterned to form a plurality of separate active pillars 132.

The active lines 131 are patterned by a selective etching process to form the active pillars 132. The active pillars 132 are arrayed along a first direction (y direction) and a second direction (x direction). In this embodiment, only the active lines 131 are patterned. In other embodiments, the isolation dielectric layers 500 may also be patterned at the same time. In this embodiment, an angle between the first direction and the second direction is 90°. In other embodiments, an angle between the first direction and the second direction may be comprised between 60° and 120°.

In other embodiments, after the active pillars 132 are formed, ions may be implanted in the active pillars to form a channel region and a second doped region located above the channel region.

In this embodiment, after the active pillars 132 are formed, the channel region is formed above the first doped region 1311 at the bottoms of the active pillars 132 only by means of ion implantation, and the doping concentration in the channel region is adjusted by ion implantation to adjust the threshold voltage of a formed transistor. The channel region may be of a P-type or N-type doping type. A suitable doping type and a suitable doping concentration may be selected according to the requirement for the threshold voltage. In other embodiments, the channel region may not be doped.

In other embodiments, during formation of the active layer 130 (referring to FIG. 1), a doped channel layer may be formed in the active layer 130 by means of in-situ doping, and after the active layer 130 is patterned to form the active pillars 132, the doped channel layer is patterned to form the channel regions.

In the embodiments of this application, a second doped region may be formed above the channel region by means of ion implantation; or during formation of the active layer 130, a second doped layer is formed at the corresponding position by means of in-situ doping, so that after the active layer 130 is patterned to form the active pillars 132, the second doped layer is patterned to form the second doped region.

In other specific manners, the active lines may not be doped to form the first doped region 1311 in the above operation, but after the active pillars 132 are formed in this operation, the first doped region at the bottoms of the active pillars 132 is formed by means of diffusion treatment or ion implantation of the doped transition layer.

Figure 11A:
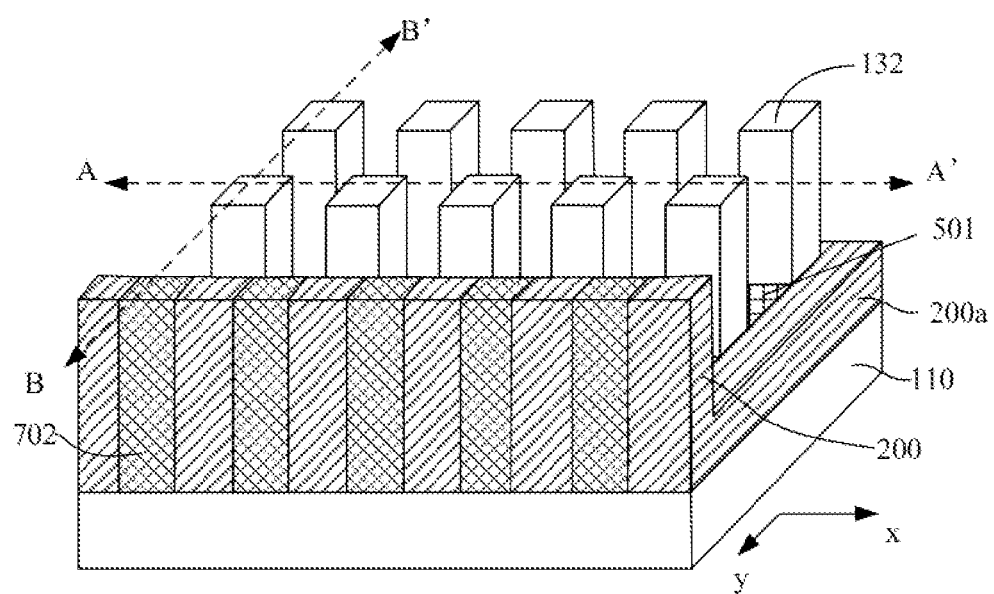
Figure 11B:
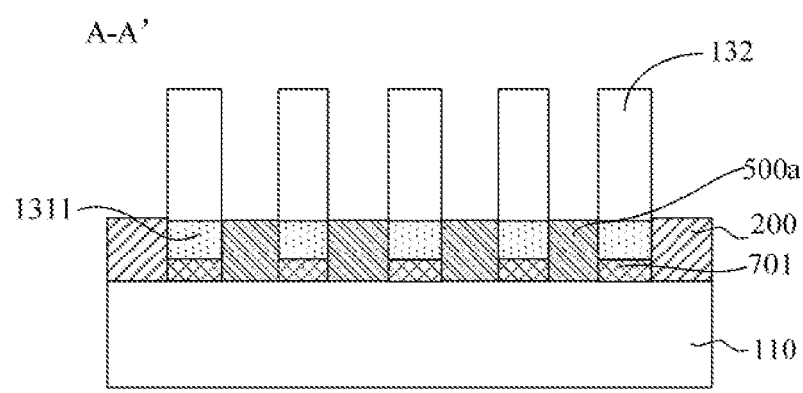
Figure 11C:
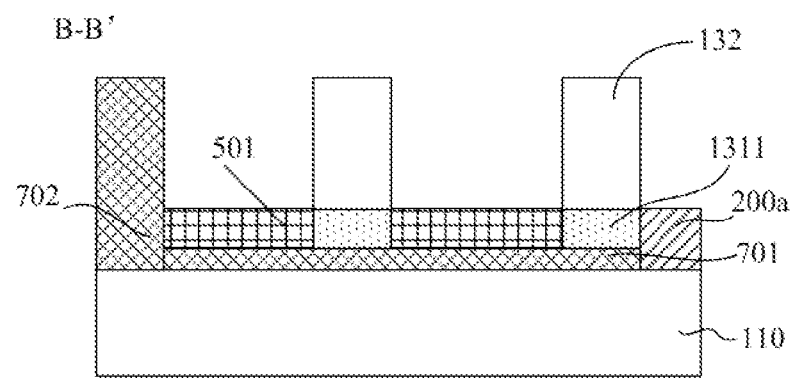

Referring to FIG. 11A to FIG. 11C, the first isolation layer 200 and the isolation dielectric layers 500 are etched back to expose a part of the height of the active pillars 132.

Before the first isolation layer 200 and the isolation dielectric layer 500 are etched, the opening located between two adjacent ones of the active pillars 132 are filled with an isolation dielectric material, and at the same time, the first isolation layer 200, the isolation dielectric layer 500 and the isolation dielectric material are etched back to respectively form a first isolation layer 200a, isolation dielectric layers 500a and isolation dielectric layers 501 after etching back. Each of the first isolation layer 200a, the isolation dielectric layers 500a and the isolation dielectric layers 501 has a height equal to that of the first doped region 1311. In this embodiment, the surfaces of the first isolation layer 200a and the isolation dielectric layers 500a and 501 after etching back are flush with the top of the first doped region 1311. In other embodiments, the surfaces of the first isolation layer 200a and the isolation dielectric layers 500a and 501 may be slightly lower or slightly higher than the top boundary of the first doped region 1311, to expose the regions of the active pillars 132 above the first doped region 1311.

During etching back of the first isolation layer 200, the bit-line-connection lines 702 and a part of the first isolation layer 200 between adjacent bit-line-connection lines 702 may be covered by a mask to prevent the bit-line-connection lines 702 and said part of the first isolation layer 200 from being etched, thereby avoiding the damage to the bit-line-connection lines 702.

In other embodiments, the first isolation layer 200 at each position may be etched back.

Figure 12A:
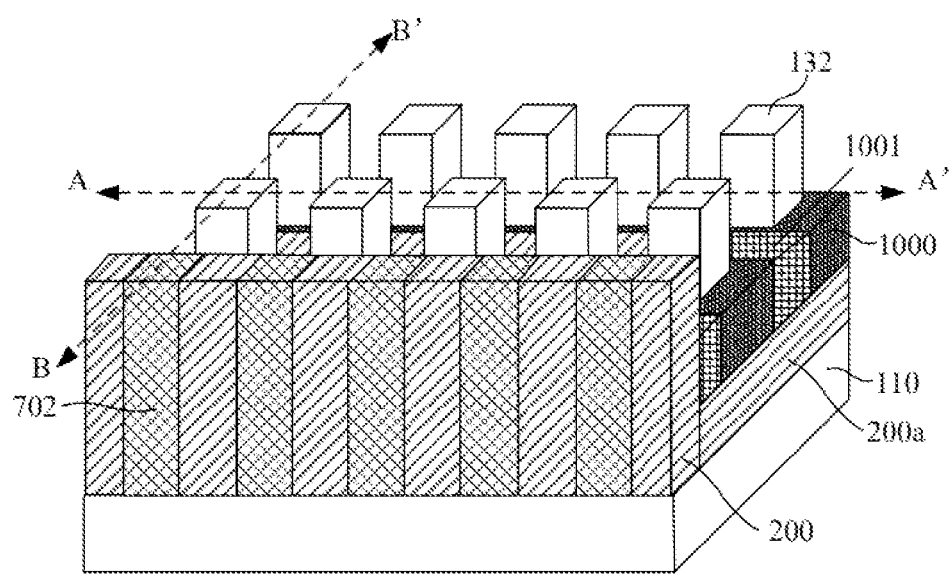
Figure 12B:
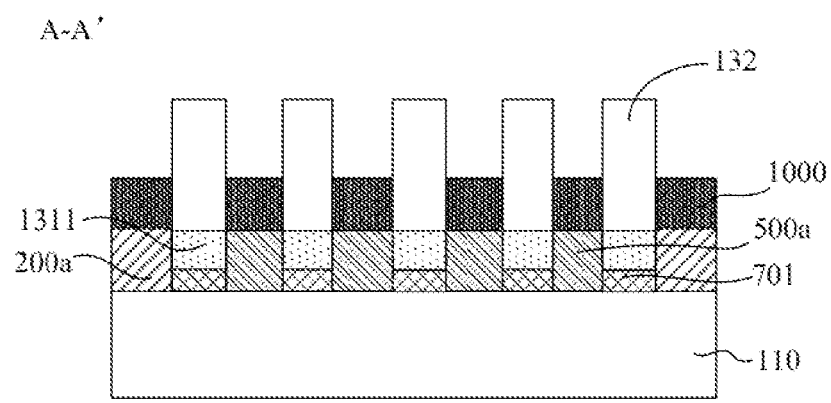
Figure 12C:
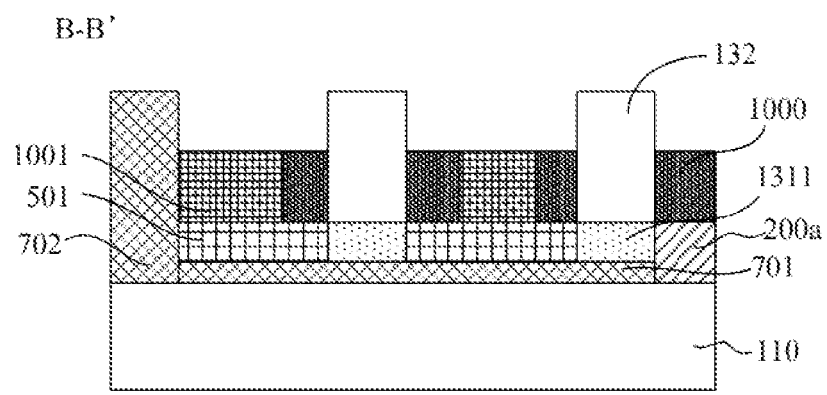

Referring to FIG. 12A to FIG. 12C, a gate dielectric layer and a gate electrode layer are sequentially formed on the surfaces of the first isolation layer 200a and the isolation dielectric layers 500a and 501 being etched back and the exposed surfaces of the active pillars 132. The gate dielectric layer and the gate electrode layer are patterned to form a gate structure 1000 surrounding the channel region of the active pillars and expose the top regions of the active pillars 132. The gate structure 1000 includes a gate electrode and a gate dielectric layer. In FIG. 12A, only the gate electrode is shown, and the gate electrode layer is omitted.

Before the gate dielectric layer and the gate electrode layer are deposited, an isolation material is filled in the gap between the active pillars 132 arranged along the first direction and etched back to the height of the first doped region 1311 to cover the first doped region 1311.

The material of the gate dielectric layer may be a gate dielectric material such as silicon oxide, hafnium oxide or aluminum oxide. The material of the gate electrode layer may be a conductive material such as polysilicon, tungsten, copper or aluminum. The gate dielectric layer and the gate electrode layer covering the surface of the structure in FIG. 11A may be sequentially formed by means of a deposition process, and then, the gate dielectric layer and the gate electrode layer are patterned by means of an etching process to form the gate structure 1000. The gate structure 1000 surrounds the channel region of the active pillars 132.

In this embodiment, the gate electrodes of the gate structures 1000 on the surfaces of the active pillars 132 in the same straight line arranged in the second direction (x direction) are connected with each other to form word lines.

In other embodiments, the gate structures 1000 on the surfaces of the active pillars 132 may also be independent of each other.

In order to perform electrical isolation between the gate structures 1000, after the gate structures 1000 are formed, an isolation dielectric layer 1001 is filled between two adjacent ones of the gate structures 1000.

Figure 13:
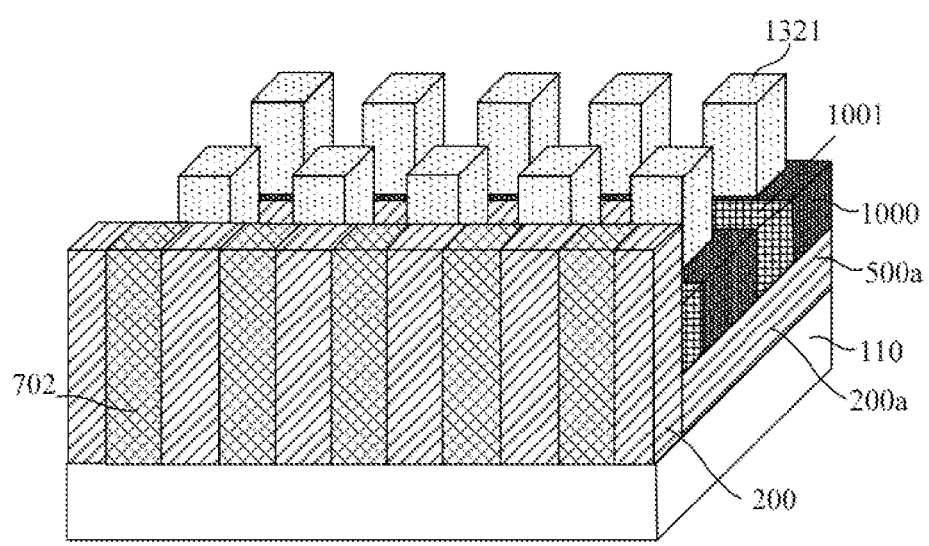

Referring to FIG. 13, after the gate structures 1000 are formed, ions are implanted in the top region of each of the active pillars 132 to form second doped regions 1321.

The doping type of the second doped region 1321 is the same as the doping type of the first doped region 1311. One of the second doped region 1321 and the first doped region 1311 serves as a source electrode of a vertical transistor, and the other one of the second doped region 1321 and the first doped region 1311 serves as a drain electrode of the vertical transistor. In other embodiments, the second doped region 1321 may also be formed in the above operations by means of a suitable manner of in-situ doping, diffusion or implantation, which will not be repeated here.

Figure 14A:
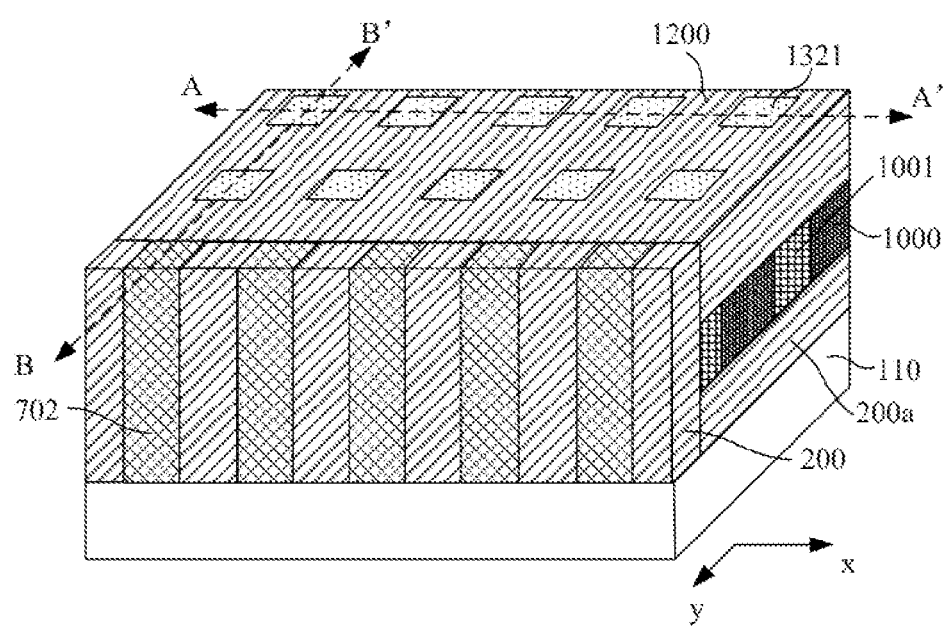
Figure 14B:
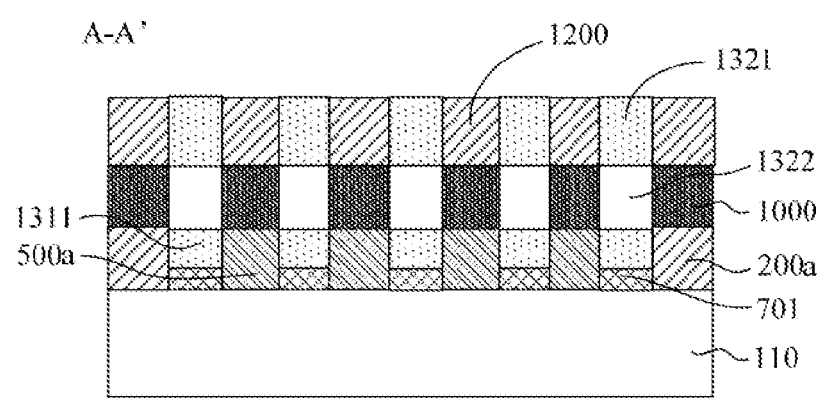
Figure 14C:
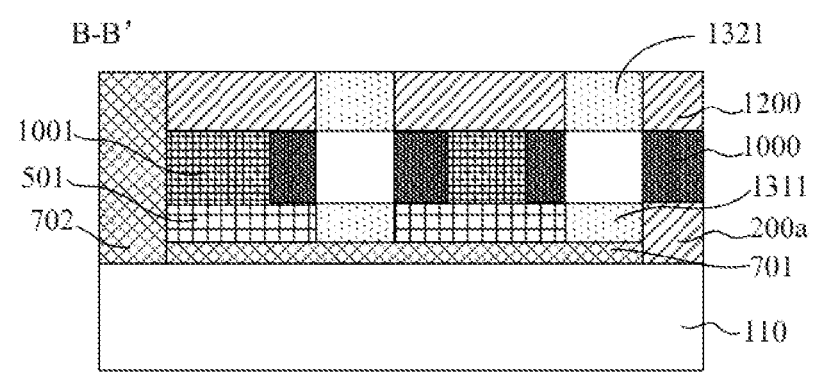

Referring to FIG. 14A to FIG. 14C, a second isolation layer 1200 covering the gate structures 1000 and the second doped regions 1321 is formed, and the second isolation layer 1200 exposes the bit-line-connection lines 702 and the top surfaces of the second doped regions 1321.

The material of the second isolation layer 1200 may be an insulating dielectric material such as silicon oxide or silicon oxynitride. The second isolation layer 1200, the first isolation layers 200 and 200a and the isolation dielectric layers 500a, 501 and 1001 form isolation layers between vertical transistors, and provide a flat surface for forming other semiconductor structures or material layers above the vertical transistors.

In the above method, vertical transistors are formed on the substrate, and buried bit lines are formed between the space below the first doped region at the bottoms of the vertical transistors and the substrate, so that the area of the transistors can be reduced, and at the same time, the problem of how to apply bit line signals to the vertical transistors is solved.

The embodiments of this application further provide a semiconductor structure.

FIG. 14A to FIG. 14C are schematic views of a semiconductor structure according to an embodiment of this application. The semiconductor structure includes: a substrate 110; vertical transistors located on the substrate 110; and bit lines 701 connected to the bottoms of the vertical transistors and located between the bottoms of the vertical transistors and the substrate 110. In this specific manner, the semiconductor structure is shown in FIG. 14A to FIG. 14C.

In other embodiments of this application, the semiconductor structure may be formed by the method in the above embodiments or other methods. All semiconductor structures with vertical transistors and buried bit lines located at the bottoms of the vertical transistors may serve as the semiconductor structure claimed in this application.

In this embodiment, the vertical transistor includes a first doped region 1311, a channel region 1322, a second doped region 1321 and a gate structure 1000 surrounding the channel region 1322, which are sequentially disposed upward from the surface of the substrate 110.

A plurality of vertical transistors are formed on the semiconductor structure and are arrayed along the first direction (y direction) and the second direction (x direction). The first doped regions 1311 at the bottoms of the vertical transistors in the same straight line arranged along the first direction are connected to the same bit line 701. The gate structures 1000 of the vertical transistors in the same straight line arranged along the second direction are connected with each other.

The semiconductor structure further includes isolation layers located on the substrate 110 and formed between the vertical transistors. The isolation layers include isolation dielectric layers 500a between the bit lines 701 in different straight lines and between the first doped regions 1311 in different straight lines, isolation dielectric layers 501 between adjacent first doped regions 1311 in the same straight line, isolation dielectric layers 1001 between adjacent gate structures 1000, second isolation layers 1200 on the surfaces of the isolation dielectric layers 1001 and between adjacent second doped regions 1321, and first isolation layers 200a at the peripheries of the vertical transistors.

The semiconductor structure further includes through holes penetrating through the isolation layers. Bit-line-connection lines 702 are formed in the through holes, and a bottom of each of the bit-line-connection lines 702 is connected to a respective one of the bit lines 701. In this embodiment, the bit-line-connection lines 702 are located at the edge of one side of a transistor array, a bit-line-connection line 702 is formed on one side of each row of transistors arranged along the y direction and is connected to the bit line 701 below said row of transistors, and first isolation layers 200 are provided between adjacent bit-line-connection lines 702.

In some embodiments, the first doped region 1311, the channel region 1322 and the second doped region 1321 of the vertical transistor are located in the same active pillar. Said active pillar is integrally formed, and the first doped region 1311, the channel region 1322 and the second doped region 1321 are formed by doping. In other embodiments, the channel region 1322 and the second doped region 1321 of the vertical transistor are formed in an epitaxial semiconductor pillar on the surface of the first doped region 1311, and the semiconductor layer where the channel region 1322 and the second doped region 1321 are located and the epitaxial semiconductor pillar are not integrally formed, but are formed separately.

The doped ions in the first doped region 1311 and/or the second doped region 1321 are formed by means of diffusion or ion implantation.

The embodiments of this application further provide a memory and a method for forming the memory.

Firstly, a semiconductor structure is provided. The semiconductor structure includes: a substrate; vertical transistors located on the substrate; and bit lines each connected to a bottom of a respective one of the vertical transistors and located between the bottom of the respective one of the vertical transistors and the substrate. In this specific manner, the semiconductor structure is shown in FIG. 14A to FIG. 14C. The semiconductor structure may be formed by the method in the above embodiments or other methods. All semiconductor structures with vertical transistors and buried bit lines located at the bottoms of the vertical transistors may serve as the semiconductor structure claimed in this application.

Figure 15:
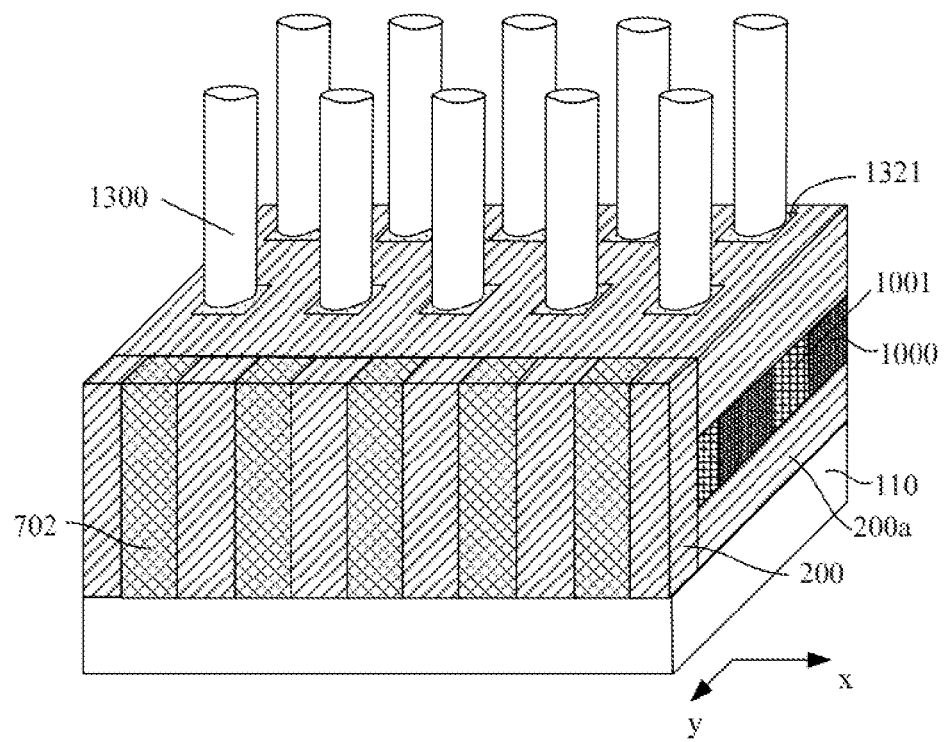
FIG. 15 is a schematic view of a memory according to an embodiment of this application.

Referring to FIG. 15, memory cells 1300 are formed above the vertical transistors, and each of the memory cells 1300 is connected to the second doped region 1321 of a respective one of the vertical transistors.

In an embodiment, the memory is a Dynamic Random Access Memory (DRAM). The memory cell 1300 is a metal capacitor, including an upper electrode, a lower electrode and a capacitor dielectric layer between the upper electrode and the lower electrode. The structure of the capacitor may be a planar capacitor, a cylindrical capacitor, etc. Those skilled in the art can select a capacitor with a suitable structure as the memory cell according to the needs. In FIG. 15, the memory cell 1300 is only an example, and does not represent an actual structure of the capacitor. In this embodiment, the second doped region 1321 of each of the transistors is connected to a memory cell to form a 1T1C storage structure. The memory cell may include one capacitor, or two or more capacitors connected in parallel.

In other embodiments, in order to reduce the connection resistance between the second doped region 1321 and the memory cell 1300, a metal contact layer may be formed on the surface of the second doped region 1321, and then the memory cell is formed on the surface of the metal contact layer.

The memory cell 1300 is formed in a dielectric layer (not shown), and an interconnection structure for connecting the bit-line-connection lines 702 and the gate structures 1000 with each other may also be formed in the dielectric layer, so as to connect the bit lines and word lines to an external circuit.

In other embodiments of this application, the memory cell may also be a magnetic memory cell, a ferroelectric memory cell, a phase change memory cell or a resistance memory cell.

Figure 16:
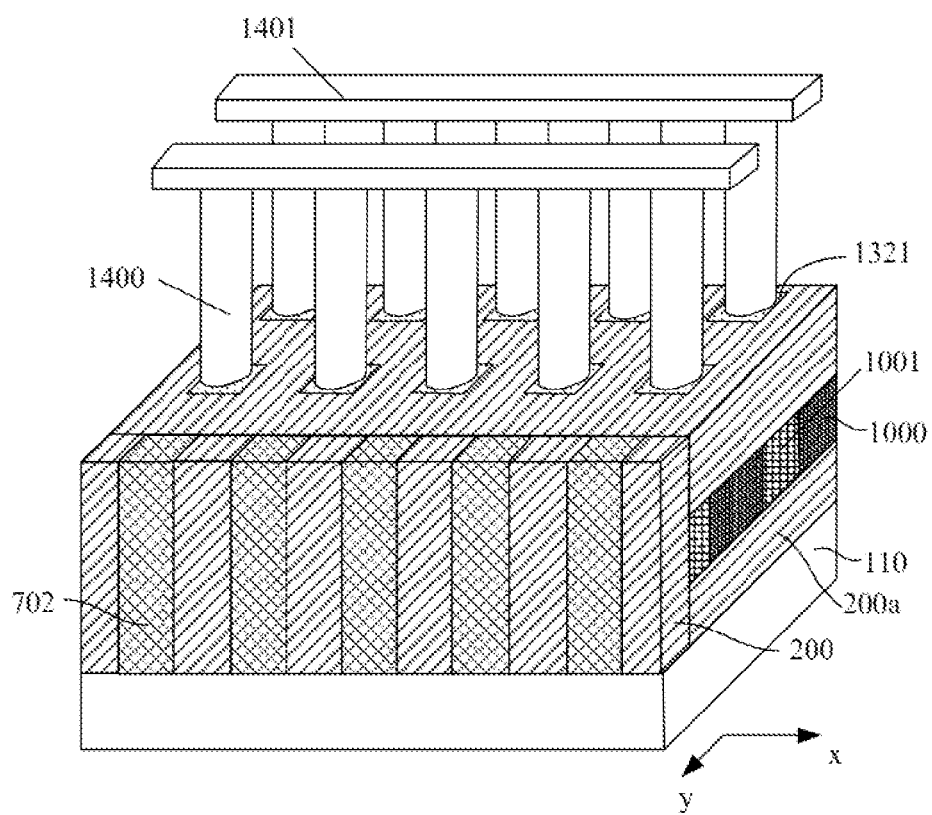
FIG. 16 is a schematic view of a memory according to an embodiment of this application.

FIG. 16 is a schematic view of a memory according to an embodiment of this application.

The memory is a Ferroelectric Random Access Memory (FeRAM). Ferroelectric memory cells 1400 are formed above the second doped regions 1321 of the vertical transistors of the semiconductor structure shown in FIG. 14A.

The ferroelectric memory cell includes a lower electrode connected to the second doped region 1321, an upper electrode located above the lower electrode, and a ferroelectric capacitor formed by a ferroelectric material layer located between the upper electrode and the lower electrode. The material of the ferroelectric material layer may be lead zirconate titanate (PZT) or barium strontium titanate (SBT). The ferroelectric memory cell 1400 in FIG. 16 is only an example, and does not represent an actual structure of the ferroelectric memory cell. Those skilled in the art may form a ferroelectric memory cell 1400 with a corresponding structure according to the needs, which is not limited here.

For the ferroelectric memory cells 1400, it is also necessary to form plate lines 1401 connected to the upper electrodes above the ferroelectric memory cells 1400. In this embodiment, the ferroelectric memory cells arranged along the second direction (x direction) and located in the same straight line are connected to the same plate line 1401, and the bidirectional pressurization on the ferroelectric memory cells 1400 may be realized by the plate lines 1401 and the vertical transistors, thereby implementing data storage by means of the properties of the ferroelectric material layer.

In other embodiments, a magnetic memory cell may also be formed on the second doped region 1321 of the vertical transistor. The magnetic memory cell includes a magnetic tunnel junction. The magnetic tunnel junction includes a fixed layer, a free layer and a dielectric layer located between the fixed layer and the free layer. The fixed layer is connected to the second doped region 1321.

In other embodiments, memory cells with other structures or types, such as capacitance memory cells, magnetic memory cells, ferroelectric memory cells, phase change memory cells or resistance memory cells, may also be formed to form corresponding memories.

According to the above memory and the method for forming the memory, the vertical transistors are used as control transistors connected to the memory cells, and buried bit lines connected to the control transistors are used, so that the storage density of the memory may be improved.

The above embodiments are only preferred embodiments of this application. It should be noted that those skilled in the art can make several improvements and modifications without departing from the principles of this application, and these improvements and modifications should also be regarded as within the protection scope of this application.

The invention claimed is:

1. A method for forming a semiconductor structure, comprising:
    providing a substrate, wherein a sacrificial layer and an active layer located on the sacrificial layer are formed on the substrate;
    patterning the active layer and the sacrificial layer to form a groove, wherein the active layer and the sacrificial layer are divided into a plurality of active regions by the groove;
    filling the groove to form a first isolation layer surrounding the active regions;
    patterning the active layer in the active regions to form a plurality of separate active lines, wherein the active lines are arranged in parallel and extend along a first direction, and at least one end side wall of the active lines is connected to the first isolation layer;
    removing the sacrificial layer along an opening located between two adjacent ones of the active lines to form a gap between a bottom of the active lines and the substrate;
    forming a bit line in the gap; and
    patterning the active lines to form a plurality of active pillars arrayed along the first direction and a second direction.

2. The method for forming the semiconductor structure of claim 1, wherein after the bit line is formed, the method further comprises forming an isolation dielectric layer to fill a space between the two adjacent ones of the active lines.

3. The method for forming the semiconductor structure of claim 1, further comprising:
    forming a first doped region, a channel region and a second doped region which are located at a bottom of each of the active pillars and are sequentially disposed upward; and
    forming a gate structure surrounding the channel region.

4. The method for forming the semiconductor structure of claim 3, wherein forming the first doped region, the channel region and the second doped region comprises:
    doping the active layer using an in-situ doping process to sequentially form a first doped layer, a channel doped layer and a second doped layer during formation of the active layer through an epitaxial growth process; and
    respectively patterning the first doped layer, the channel doped layer and the second doped layer to form the first doped region, the channel region and the second doped region which are sequentially disposed upward from the bottom of each of the active pillars, after the active pillars are formed through patterning the active lines.

5. The method for forming the semiconductor structure of claim 3, wherein forming the first doped region comprises: implanting first ions in a bottom region of each of the active lines; and forming the second doped region comprises: implanting second ions in a top region of each of the active lines.

6. The method for forming the semiconductor structure of claim 1, wherein a plurality of openings are defined, a plurality of bit lines are formed, and forming the bit lines further comprises:

forming a plurality of bit lines, comprising:
    forming a conductive material layer filling the gap and the openings; and
    patterning the conductive material layer, wherein only parts of the conductive material layer extending along the first direction at the bottom of the active lines are retained to serve as the bit lines.

7. The method for forming the semiconductor structure of claim 1, wherein a plurality of bit lines are formed and the method further comprises:
    etching the first isolation layer or ends of the active lines to form through holes; and
    filling a conductive material in the through holes to form bit-line-connection lines, wherein a bottom of each of the bit-line-connection lines is connected to a respective one of the bit lines.

8. The method for forming the semiconductor structure of claim 7, wherein the through holes are located at edges of the active regions.

9. The method for forming the semiconductor structure of claim 7, wherein the bit-line-connection lines and the bit lines are formed in a same process.

10. The method for forming the semiconductor structure of claim 3, wherein forming the first doped region comprises:
    after the active lines or the active pillars are formed, forming a transition layer with doped elements on a surface of the substrate between the two adjacent ones of the active lines or two adjacent ones of the active pillars; and
    diffusing at least a part of the doped elements in the transition layer into the active lines or the active pillars through diffusion treatment to form the first doped region.

11. The method for forming the semiconductor structure of claim 3, wherein forming the gate structure comprises:
    etching back the first isolation layer and an isolation dielectric layer to expose the active pillars on the first doped region;
    sequentially forming a gate dielectric layer and a gate electrode layer on surfaces of the first isolation layer and the isolation dielectric layer and exposed surfaces of the active pillars; and
    patterning the gate dielectric layer and the gate electrode layer to form the gate structure surrounding the channel region of the active pillars and expose top regions of the active pillars.

12. The method for forming the semiconductor structure of claim 11, wherein the gate structure on the surfaces of the active pillars in a same column arranged in the second direction are connected with each other.

13. The method for forming the semiconductor structure of claim 3, further comprising:
    forming a second isolation layer covering the gate structure and the second doped region, wherein the second isolation layer exposes a top surface of the second doped region.

14. A semiconductor structure, comprising:
    a substrate;
    a plurality of separate active lines located on the substrate, wherein a gap is formed between a bottom of the active lines and the substrate;
    a first isolation layer located on the substrate and surrounding the active lines, wherein the active lines are arranged in parallel and extend along a first direction, and at least one end side wall of the active lines is connected to the first isolation layer; and
    bit lines located in the gap.

15. The semiconductor structure of claim 14, wherein the semiconductor structure further comprises an isolation dielectric layer disposed between two adjacent ones of the active lines.

16. The semiconductor structure of claim 14, wherein the semiconductor structure further comprises:
    active pillars obtained by patterning the active lines, wherein a first doped region, a channel region and a second doped region are sequentially disposed upward from a bottom of the active pillars; and
    a gate structure surrounding the channel region.

17. A memory, comprising:
    a semiconductor structure, the semiconductor structure comprising: a substrate; a plurality of separate active lines located on the substrate, wherein a gap is formed between a bottom of the active lines and the substrate; a first isolation layer located on the substrate and surrounding the active lines, wherein the active lines are arranged in parallel and extend along a first direction, and at least one end side wall of the active lines is connected to the first isolation layer; and bit lines located in the gap; and
    a memory cell located above the semiconductor structure, wherein the memory cell is connected to a top of a respective one of the active lines.

18. The memory of claim 17, wherein the memory cell comprises a capacitance memory cell, a magnetic memory cell, a ferroelectric memory cell, a phase change memory cell or a resistance memory cell.

* * * * *